United States Patent [19]

Kawata et al.

[11] Patent Number: 4,979,066
[45] Date of Patent: Dec. 18, 1990

[54] LOADING CONTROLLING APPARATUS

[75] Inventors: Toshihiko Kawata, Furukawa; Ken Mizuta, Miyagi; Kazuaki Fukuda, Furukawa, all of Japan

[73] Assignee: Alps Electric Co., Ltd., Tokyo, Japan

[21] Appl. No.: 537,210

[22] Filed: Jun. 12, 1990

Related U.S. Application Data

[63] Continuation of Ser. No. 282,416, Dec. 9, 1988, abandoned.

[30] Foreign Application Priority Data

Mar. 4, 1988 [JP] Japan ................... 63-52311

[51] Int. Cl.[5] .............................. H02H 7/20
[52] U.S. Cl. ....................... 361/10; 361/79; 323/276
[58] Field of Search ............... 361/79, 86-88, 361/18; 323/276, 275, 277

[56] References Cited

U.S. PATENT DOCUMENTS

| | | | |
|---|---|---|---|
| 3,921,059 | 11/1975 | Birman et al. | 323/276 X |
| 4,326,245 | 4/1982 | Saleh | 323/275 X |
| 4,441,136 | 4/1984 | Hampshire | 361/88 |
| 4,616,302 | 10/1986 | Mandelcorn | 361/18 X |
| 4,639,609 | 1/1987 | Floyd et al. | 307/10 R |

Primary Examiner—Todd E. Deboer
Attorney, Agent, or Firm—Guy W. Shoup; David W. Heid

[57] ABSTRACT

In a load controlling apparatus used in, for instance, an automobile, equipped with a mulfunction diagnostic circuit, there are employed:
a power source V;
a load 1 operated by power supplied from the power source V;
a drive 3 for controlling supply of the power to the load 1;
a control 4 for supplying a control signal "a" to the drive 3;
a first and second detector 2, b for detecting the current flowing condition "b" to the load 1 based upon the control signal "a" derived from the control 4, and also the voltage condition "C" applied to the load 1;
a judging device 11 to 18 for judging an extraordinary condition of the load 1 and the drive 3 based upon the signals from the first and second detector 2, b, and the control signal "a"; and,
a display outputting a signal "d" representative of the respective extraordinary condition of the load 1 and the drive 3 based upon the judgement result obtained from the judging device 11 to 18.

3 Claims, 8 Drawing Sheets

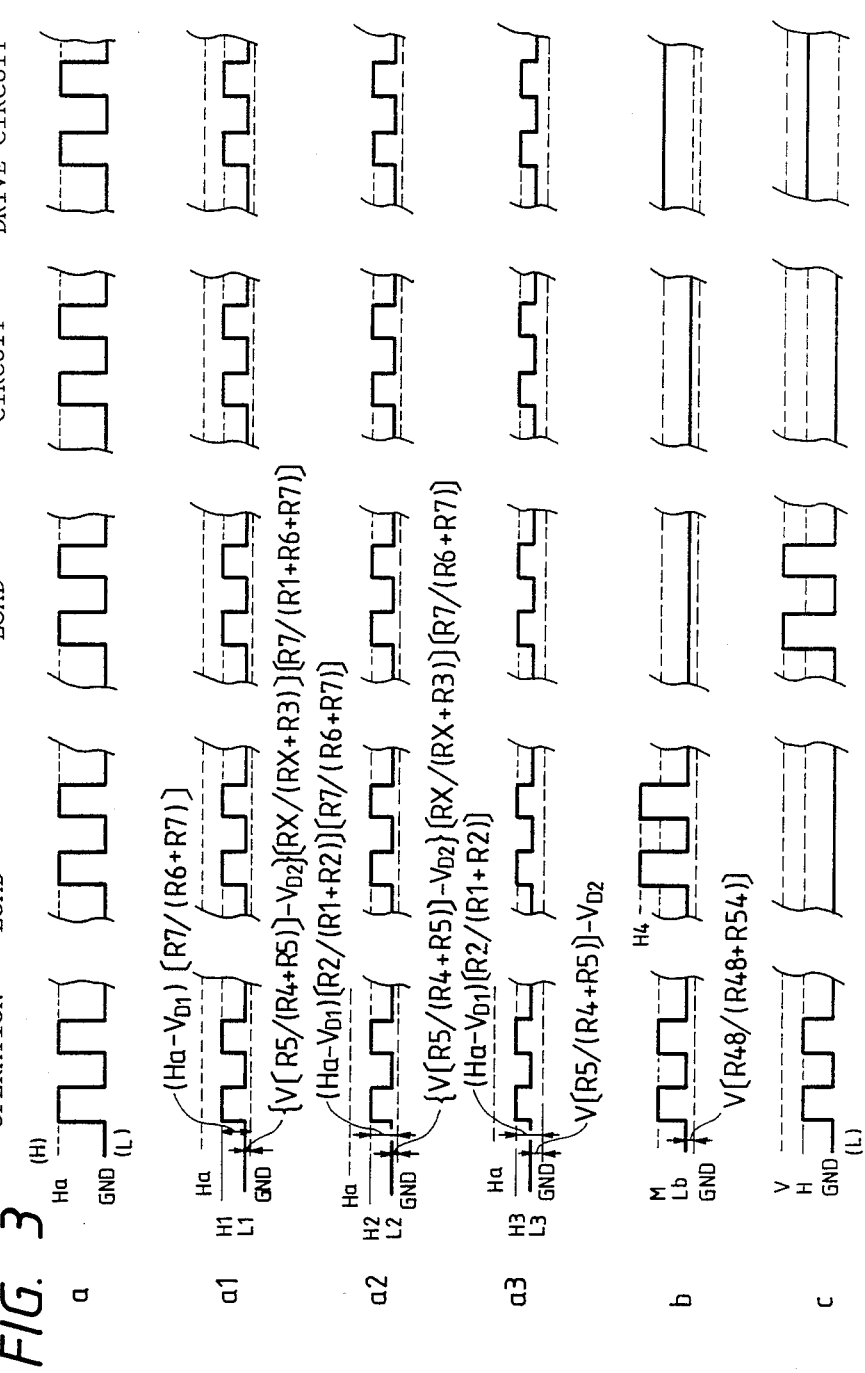

FIG. 4

OPERATION LIST

| | | NORMAL OPERATION | SHORT-CIRCUITED LOAD | OPENED LOAD | OPENED DRIVE CIRCUIT | SHORT-CIRCUITED DRIVE CIRCUIT |
|---|---|---|---|---|---|---|
| CONTROL SIGNAL a "L" | CURRENT DETECTING SIGNAL b | Lb | Lb | Lb | Lb | M |
| | VOLTAGE DETECTING SIGNAL c | L | L | L | L | H |
| CONTROL SIGNAL a "H" | CURRENT DETECTING SIGNAL b | M | H4 | Lb | Lb | M |
| | VOLTAGE DETECTING SIGNAL c | H | L | V | L | H |
| COMPARATOR SIGNAL 11a | | L | H | L | L | L |
| JUDGEMENT SIGNAL 16a | | L | H | L | L | L |
| COMPARATOR SIGNAL 12a | | L | L | L→H | L→H | L |
| JUDGEMENT SIGNAL 17a | | L | L | L→H | L | L |
| COMPARATOR SIGNAL 13a | | H→L | H | H→L | H | L |
| JUDGEMENT SIGNAL 18a | | L | L | L | L→H | L |
| COMPARATOR SIGNAL 14a | | L | H | H | H | L |
| FEEDBACK SIGNAL e | | L | L | L | L | H→L |
| DISPLAY SIGNAL d2 | | L | H | L | L | H |
| DISPLAY SIGNAL d3 | | L | L | H | L | L |
| DISPLAY SIGNAL d1 | | L | L | L | H | L |
| DISPLAY SIGNAL d4 | | L | L | L | L | H |

LOADING CONTROLLING APPARATUS

This application is a continuation of application Ser. No. 07/282,416, filed 12/09/88 now abandoned.

BACKGROUND OF THE INVENTION

1. Field of the Invention

The present invention generally relates to a load controlling apparatus for controlling a desired quantity of power supplied from a common power source to a plurality of electric loads. More specifically, the present invention is directed to a load controlling apparatus capable of preventing occurrences of failure of other relevant circuits, and capable of quickly judging work contents of maintenance or repair.

2. Description of the Related Art

In general, when desired power is supplied from one power supply source to a plurality of loads in response to a control signal supplied from a central processing unit, both a power supplying time period and an amount of power per unit time to the load via a drive circuit are controlled. In the conventional load controlling apparatus including such a drive apparatus, a microprocessor (simply referred to as a "CPU" hereinafter), and a semiconductor drive device have readily been employed because of the technical progress in the semiconductor devices. Since a plurality of load devices having various variations are combined and controlled in such a conventional load control apparatus, a predetermined long time is required from occurrences of disconnections and shortcircuits in the load till repairing work, so that the load controlling apparatus including the protection circuit and diagnostic circuit has been required. As one example of the above-described load drive apparatus, a conventional load controlling circuit for an automobile will now be described with reference to FIGS. 8 to 10.

FIG. 8 is a circuit arrangement of a conventional load controlling apparatus including a protection circuit where in response to a voltage signal appearing across the load, a signal input from a control circuit is interrupted at a drive circuit. FIG. 9 is a circuit arrangement of a conventional load controlling circuit including a protection circuit for interrupting an output signal derived from the control circuit based upon a value of a current flowing through the load. FIG. 10 is a circuit arrangement of a conventional load controlling apparatus including a protection circuit for interrupting the output of the control circuit based on both the load voltage and the load current, and also a diagnostic circuit for displaying the result of this diagnostic operation.

In figures, reference numeral 1 is a load; reference numeral 2 denotes a current detecting circuit of the load; reference numerals 3, 301, 302 represent drive circuits; reference numerals 401, 402 indicate control circuits; reference numeral 501 denotes a diagnostic circuit; a symbol D18 indicates a diode; a symbol Q11 is an NPN type bipolar transistor; a symbol Q12 represents a PNP type bipolar transistor; a symbol RS denotes a resistor for detecting a current value; a symbol Q13 indicates a power drive type N-MOS field effect transistor having a current detecting terminal; and a symbol "V" indicates a positive polarity power source terminal.

At first, the conventional load controlling apparatus having the protection circuit of the drive element caused by the load voltage will now be described with reference to the circuit arrangement shown in FIG. 8.

A circuit construction will be first of all described. The control circuit 401 converts an operation signal "f" produced upon the selecting operation or the like, which is input via a CPU (not shown), into a control signal "a" for supplying power to a load (lamp, motor, solenoid, heater etc.) and then supplies this control signal "a" to the drive circuit 301.

To an input unit into which the control signal "a" of the drive circuit 301 is supplied, both the base of the load driving transistor Q11 and the anode of the protection circuit diode D18 for this transistor Q11 are commonly connected. One terminal of the load 1 is connected to the emitter of the transistor Q11, whereas the power supply terminal V is connected to the collector thereof. It is so arranged that the load current flows through the other end of the load 1 connected to the load drive device by the common ground line, and the negative polarity power source terminal (not shown) connected to this common ground line, from the power source.

The base of the transistor Q12 for the protection circuit is connected to a junction between the load 1 and the emitter of the transistor Q11 so as to detect the voltage applied to the load 1, and the emitter of which transistor Q12 is connected to the cathode of the diode D18. The transistor Q12, to the base of which the voltage detection signal "C" has been supplied at a level lower than a predetermined value, will draw the base voltage of the transistor Q11 via the diode D18 to the ground potential side, since the collector of the transistor Q11 is connected to the ground line.

Then, an operation of the circuit arrangement shown in FIG. 8 will now be described. When, for instance, both ends of the load 1 are shortcircuited, the base potential of the transistor Q12 is drawn adjacent to the ground level. A portion of the supplied control signal "a" is flown through the diode D18 into the emitter-to-base of the transistor Q12. Consequently, a great control signal "a" is also flown through the emitter-to-collector of the transistor Q12. Then, since the base voltage of the transistor Q11 cannot reach the voltage level at which the predetermined power can be supplied to the load 1, the overcurrent destruction of the transistor Q11 due to the load circuit or the like can be protected.

Then, the conventional load drive apparatus including the protection circuit of the drive element by the detection signal of the load current will now be explained with reference to the circuit arrangement of FIG. 9. It should be noted that the same or similar reference numerals shown in FIG. 8 will be employed as those for denoting the same or similar circuit portions and functioning portions in the following figure, and therefore, detailed descriptions thereof will be omitted.

First, the circuit arrangement will be described. The control circuit "a" output from the control circuit 402 in accordance with the operation signal "f" is supplied to the drive circuit 3. The voltage is so applied from the power source terminal V that the load current is flown through the current detecting circuit 2 interposed between the drive circuit 3 and load 1, for detecting the load current value, the other end of the load 1 and the negative polarity terminal of the power source via the ground line.

The current detecting circuit 2 outputs a current detecting signal "b" in accordance to an internal impedance variation of the drive circuit 3 and a load impedance variation based upon the control signal "a" to the control circuit 402 with a variation in the voltage value.

The control circuit 402 adjusts the control signal "a" and supplies it to the drive circuit 3 under the condition that when the feedback current detecting signal "b" is equal to a predetermined value, the load current lower than the rated current value of the load 1 is flown during only the time in accordance with the operation signal "f".

Operations of the circuit arrangement shown in FIG. 9 will now be described. When the impedance of the load 1 is lowered in case that, for instance, a mechanical load for a motor or the like is extraordinarily increased, such a high current value which will exceed over the rated current value of the load 1 or the drive element of the drive circuit 3 is detected by the current detecting circuit 2. This high current may electrically destroy the load 1 or drive element. In the control circuit 4 into which the current detecting signal "b" has been supplied in response to this current detection, the internal impedance of the drive circuit 3 is increased and therefore the negative feedback operation is carried out only during the time period determined by the operation signal "f" of all of the input conditions, by which the load current is lower than the rated current value of the load 1 or drive element.

However, since in the load drive apparatus including the above-described protection circuit for the drive element, it cannot immediately detect how the load 1 is brought into the malfunction, the following diagnostic apparatus is required so as to diagnose the circuit portion to be repaired.

Referring now to the circuit diagram of FIG. 10, the conventional load drive apparatus including the diagnostic circuit for diagnosing the load malfunction conditions based upon a detection signal for both such a load current and a load voltage, and also the protection circuit of the drive element. It should be noted that the same or relevant reference numerals shown in FIGS. 8 and 9 will be employed for denoting the same or similar circuit portions shown in FIG. 10, and a detailed description thereof will be omitted, accordingly.

A circuit arrangement of FIG. 10 will be first described. The control signal "a" is supplied to a gate of a transistor Q13 arranged in a drive circuit 302. A drain D of this transistor Q13 is connected to the power source terminal "V", a source S thereof is connected via the load 1 to the ground line, and a terminal "K" for detecting a current is connected via a resistor "RS" to a junction between the load 1 and source S. From the junction between the terminal K and resistor RS, a voltage value corresponding to a current value flowing through the drain D to source S of the transistor Q13 is supplied as the current detection signal "b" to the diagnostic circuit 501. Also from the junction among the load 1, resistor RS and transistor Q13, a voltage is applied as the voltage detection signal "C" applied to both ends of the load 1 to the diagnostic circuit 501.

The diagnostic circuit 501 will diagnose that the circuit of the load 1 is interrupted, or disconnected under the conditions that the current detection signal "b" input to this diagnostic circuit 501 is equal to a value indicating that no current flows into the load 1, and also the voltage detection signal "C" is substantially equal to a value representing the voltage value of the power source terminal V. In addition, this diagnostic circuit 501 will diagnose that the load 1 is short-circuited under the conditions that the current detection signal "b" is equal to a value indicating that the load current exceeds over the allowable rated current value of the load 1, and also the voltage detection signal "c" is equal to a value representing that it is lower than a predetermined voltage. Then, this diagnostic apparatus will diagnose that the circuit is normally operated under other conditions. From this diagnostic circuit 501, a feedback signal "e" is supplied to the control circuit 402 by which based upon the shortcircuit diagnostic condition of the load 1, the internal impedance of the drive circuit 302 is maximized, and a display signal "d" is output via a CPU (not shown) to a display device by which the shortcircuit condition is displayed, and furthermore, the display signal "d" is output to the display device, for displaying that the circuit of the load is interrupted or disconnected.

Operations of the load controlling apparatus shown in FIG. 10 will now be described. When, for instance, the circuit of the load 1 is disconnected, as the voltage induced at the current detecting terminal k of the transistor Q13 is substantially equal to the voltage of the source S of the transistor Q13, no current is flown into the resistor RS for detecting the current, which is connected between the terminal K and source S. Accordingly, both the current detecting signal b and voltage detecting signal c having the equal "H" levels are output. Then, from the diagnostic circuit 50 to which two "H"-leveled signals have been continuously supplied during more than a predetermined time period, only the display signal d is output to the CPU with having the "H" level for displaying that the circuit of the load is disconnected. Under this condition, this CPU performs the display operation of the malfunction condition under of the load 1 which the internal impedance of the load 1 becomes extraordinarily high, i.e., open circuit condition.

To the contrary, when the load 1 is brought into the shortcircuit condition, the voltage induced at the current detecting terminal "K" of the transistor Q13 to which the "H"-leveled control signal "a" is applied, exceeds over the voltage of the drain "D" to which the load 1 is connected. As a result, the current detecting signal "b" which is higher than the "L"-leveled voltage detecting signal "C" is output to the diagnostic circuit 501. Then, from the diagnostic circuit 501 to which these two signals having the above-described conditions have been continuously supplied over a predetermined time period, the L-leveled display signal "a" representative of the shortcircuited load 1 is output to CPU. At the same time, from the diagnostic circuit 501, the feedback signal "e" is output to the control circuit 402. This feedback signal "e" is to change the internal impedance between the source "S" and drain "D" of the transistor Q1 employed in the drive circuit 302 into its the maximum value. Under this condition, CPU outputs the display signal "a" for displaying that the load is brought into the shortcircuit condition. Since the over-current does not flow through the transistor Q13 due to the "L"-leveled control signal "a" supplied to the gate "G" thereof, the destruction of this transistor Q13 is prevented.

However, according to the above-described prior art load controlling apparatus including the diagnostic circuit, since based upon the voltage value applied to the load 1 and the current value flowing through the load 1, the extraordinary condition is diagnosed to protect the drive element, the diagnostic result is given in such a way that the malfunction occurs in the load 1 even if the drive element itself is brought into the extraordinary condition such as open-circuit failure. As a consequence, a long time is required to repair the failed load controlling apparatus, and the proper protection as well as proper recovery operation cannot be performed.

As a result, an object of the present invention is to provide a load controlling apparatus by which the correct diagnostic display for the failed portion can be performed, and the repairing work can be quickly effected, and thus, the proper circuit protection operation can be executed.

SUMMARY OF THE INVENTION

To solve the above-described technical problems, the load controlling apparatus according to the present invention is characterized by comprising:

a power source V;

a load 1 operated by power supplied from the power source V;

drive means 3 for controlling supply of the power to the load 1;

control means 4 for supplying a control signal "a" to the drive means 3;

first and second detecting means 2, b for detecting the current flowing condition "b" to the load 1 based upon the control signal "a" derived from the control means 4, and also the voltage condition "C" applied to the load 1;

judging means 11 to 18 for judging an extraordinary condition of said load 1 and drive means 3 based upon the signals from said first and second detecting means 2, b, and said control signal a; and, display outputting means for outputting a signal "d" representative of the respective extraordinary conditions of said load 1 and said drive means 3 based upon the judgement result obtained from said judging means 11 to 18.

In accordance with the above-described load controlling apparatus, the malfunction diagnostic operation is carried out based upon the control signal "a" by which the power is supplied to the load 1, the current detecting value "b" flown into the load 1, and the voltage detecting value "c" applied to the load 1. As a result, the correct repairing work can be quickly effected to the failed circuit portion, the required circuit protection operation is performed based upon the correct diagnostic result, and/or the automatic recovery operation is performed, resulting in the highly reliable load controlling apparatus.

BRIEF DESCRIPTION OF THE DRAWINGS

The aforementioned aspects and other features of the invention are explained in the following description, taken in connection with the accompanying drawings, in which:

FIG. 3 is a waveform for explaining various operation conditions of FIGS. 1 and 2;

FIG. 4 is a chart for illustrating a series of operation of FIGS. 1 and 2;

DETAILED DESCRIPTION OF THE PREFERRED EMBODIMENTS

Figure 1:
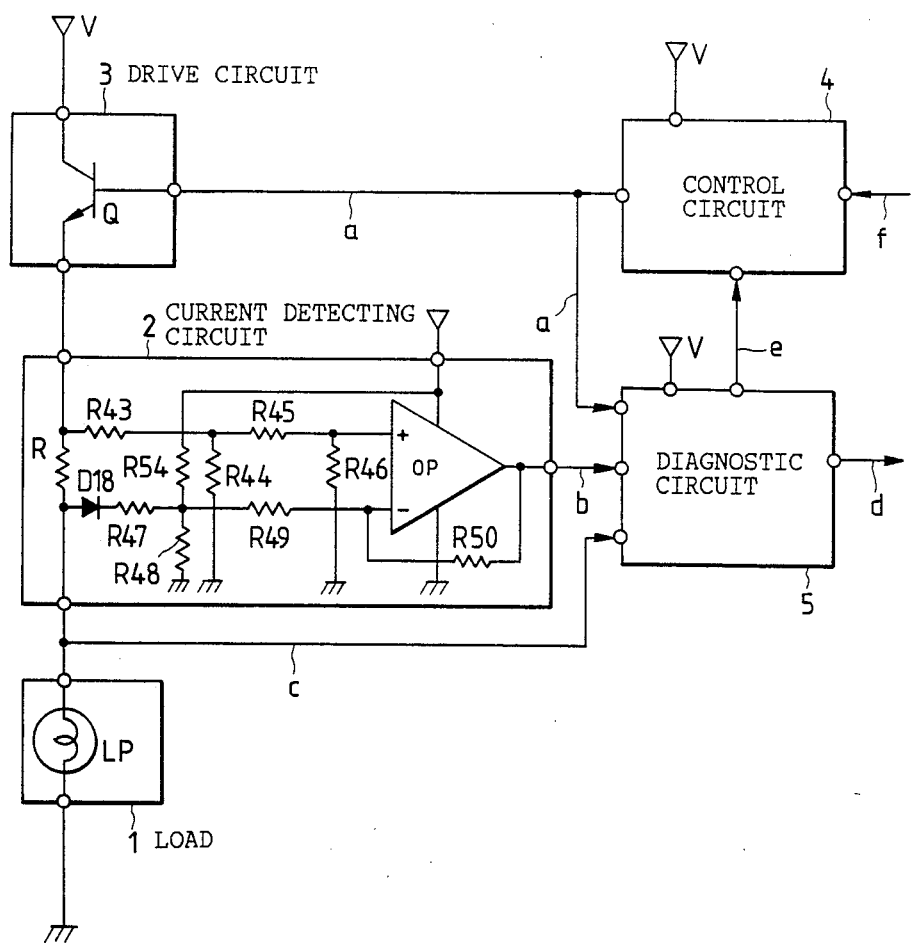
FIG. 1 is a circuit arrangement of a load controlling apparatus according to one preferred embodiment of the invention.

Referring now to FIGS. 1 to 7, a load controlling apparatus according to the present invention will be described in detail.

It should be noted that the same or relevant reference numerals shown in the conventional load controlling apparatus will be employed for denoting the same or similar circuit portions or functioning portions shown in the following figures.

Figure 2:
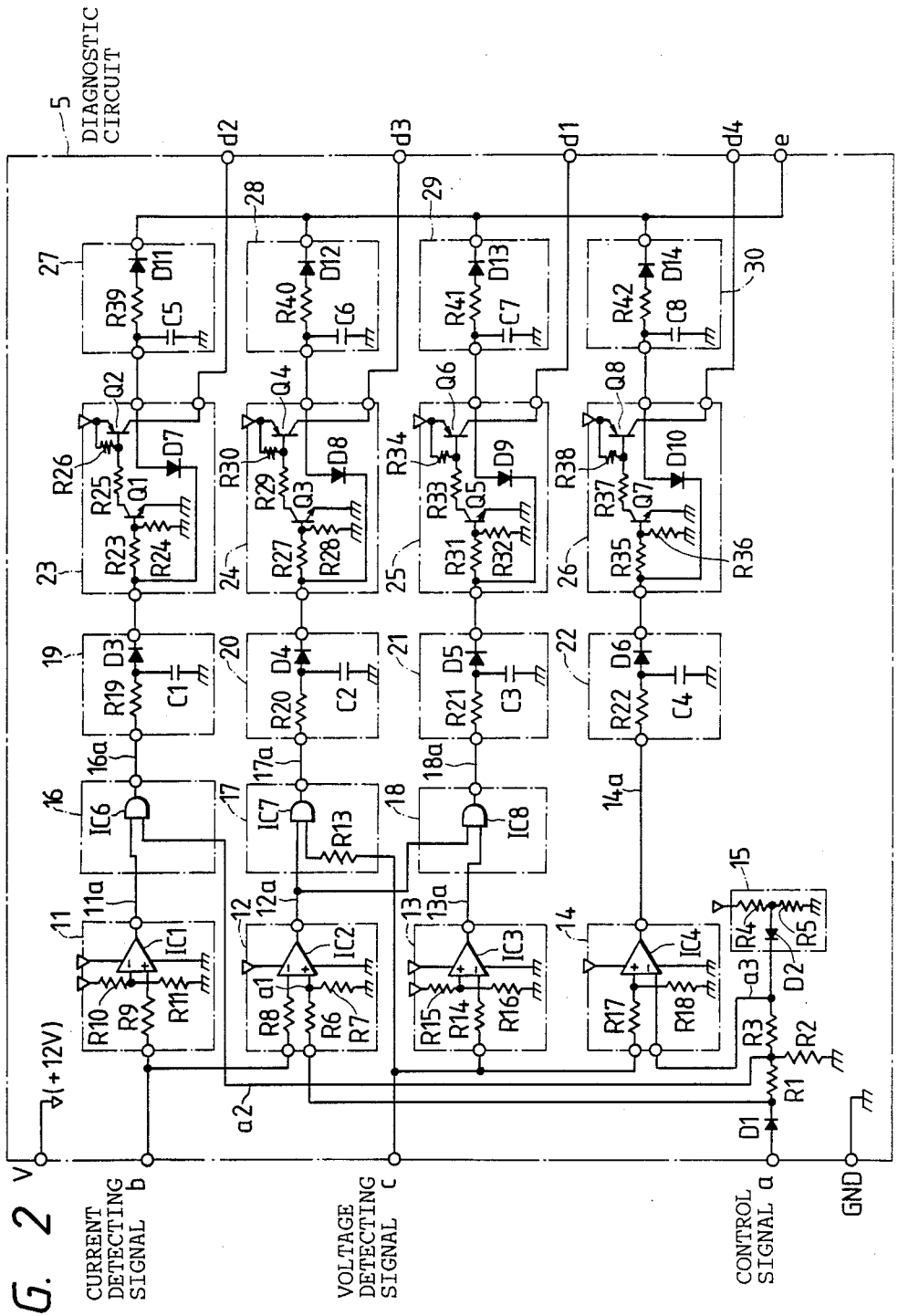
FIG. 2 is a detailed circuit arrangement of the diagnostic apparatus shown in FIG. 1.
Figure 5:
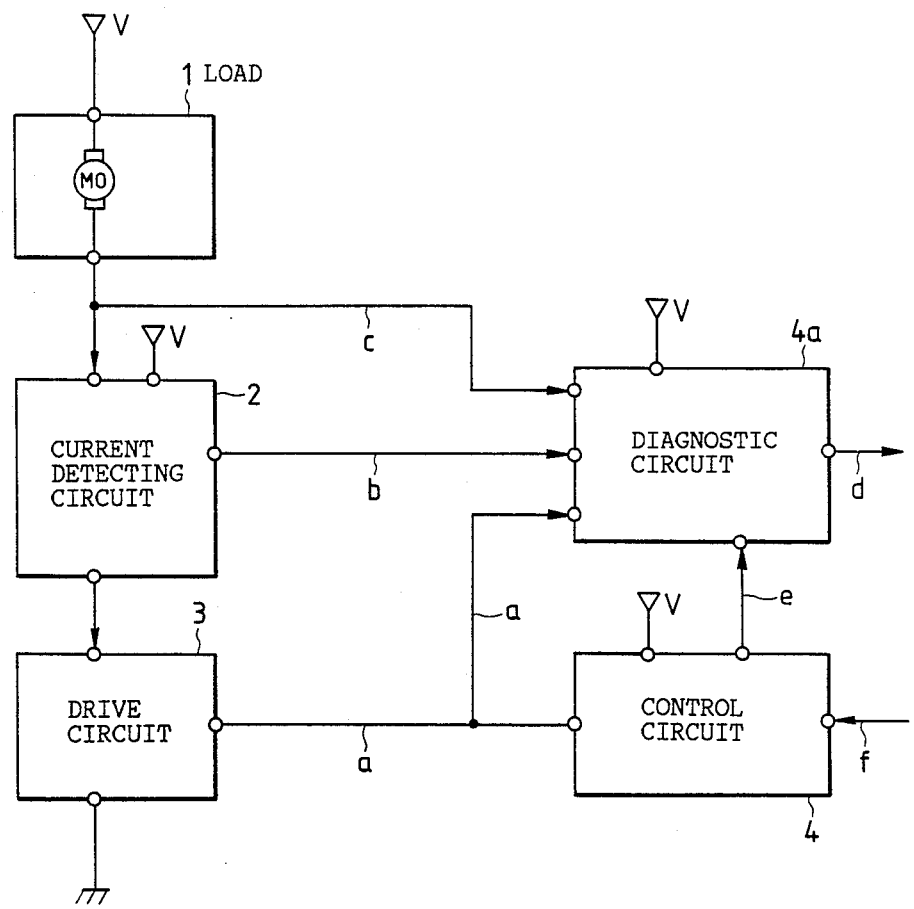
FIG. 5 is a circuit arrangement of the modified arrangement shown in FIG. 2.
Figure 6:
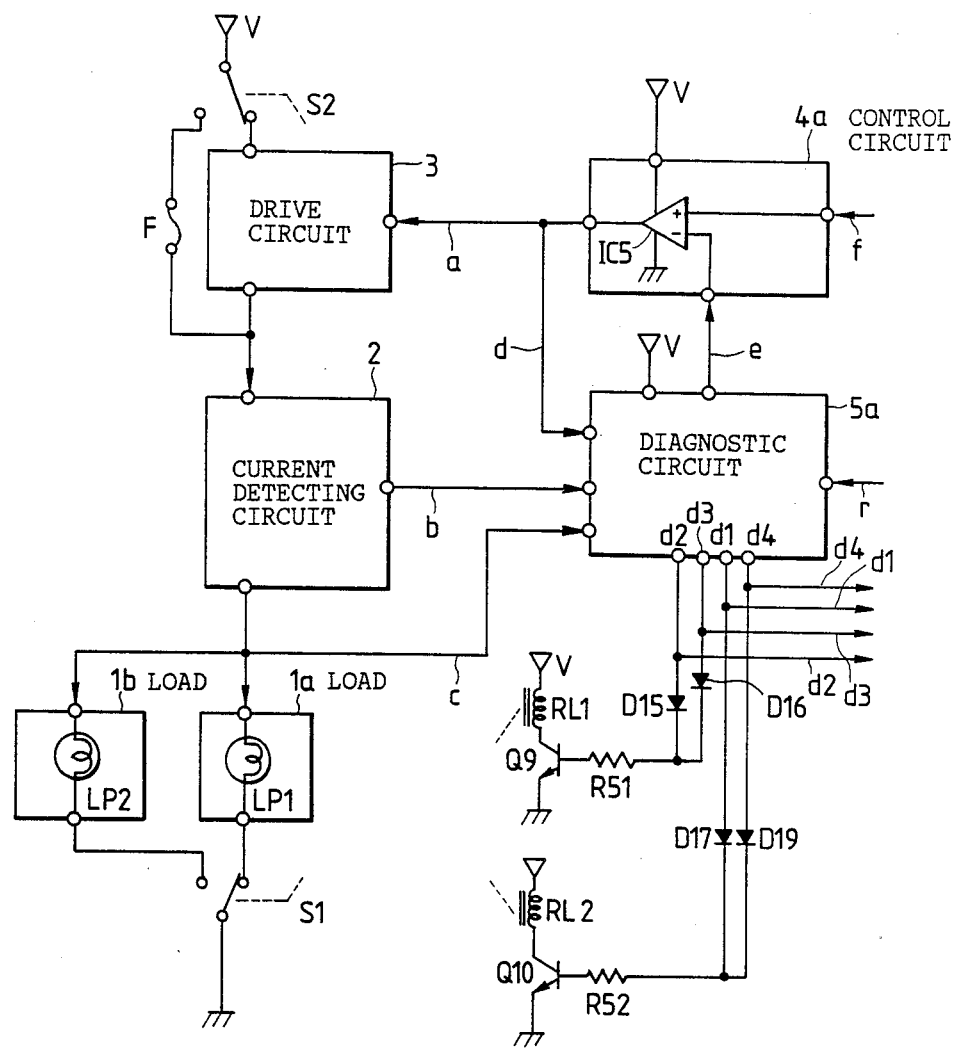
FIG. 6 is a circuit arrangement according to another preferred embodiment of the invention.
Figure 7:
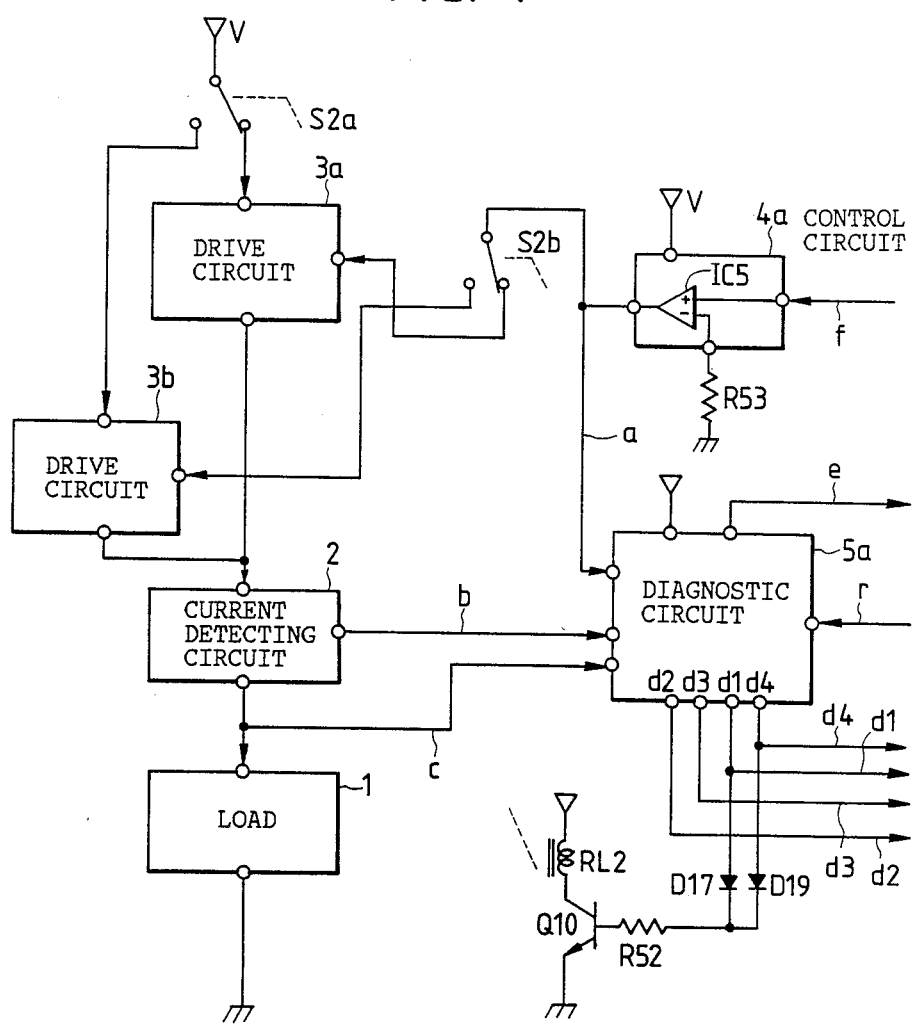
FIG. 7 is a circuit arrangement of another modified arrangement of FIG. 6.
Figure 8:
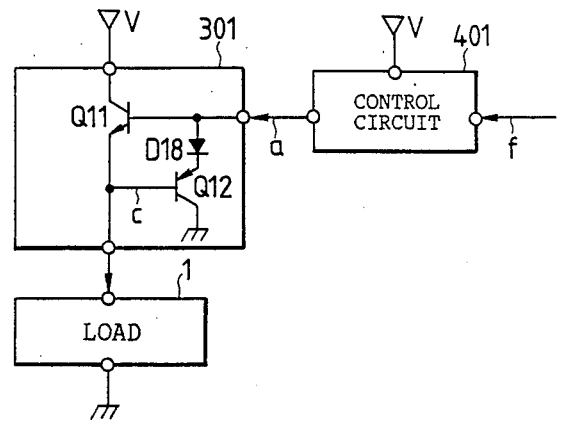
FIGS. 8 to 10 are circuit arrangements of the conventional load controlling apparatus.
Figure 9:
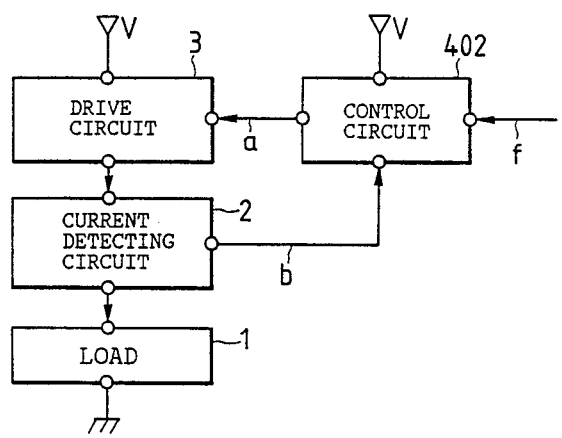
Figure 10:
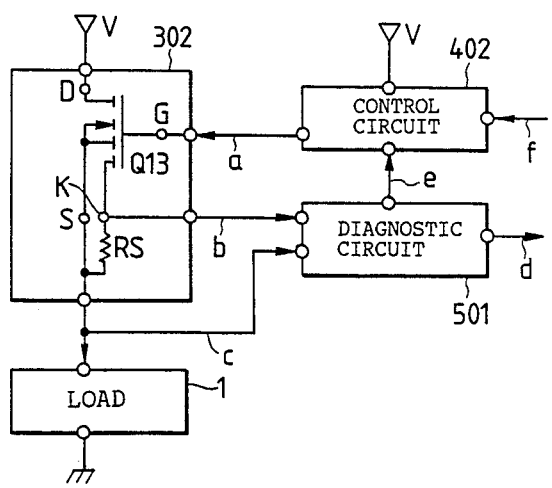

FIG. 1 is a circuit arrangement of a load controlling apparatus according to one preferred embodiment of the invention; FIG. 2 is a detailed circuit arrangement of the diagnostic apparatus shown in FIG. 1; FIG. 3 is a waveform for explaining various operation conditions of FIGS. 1 and 2; FIG. 5 is a circuit arrangement of the modified arrangement shown in FIG. 2; FIG. 6 is a circuit arrangement according to another preferred embodiment of the invention; FIG. 7 is a circuit arrangement of another modified arrangement of FIG. 6.

In the figures, reference numerals 1, 1a, 1b denote a load; 2 is a current detecting circuit; 3, 3a, 3b represent a drive circuit; 4, 4a indicate a control circuit; 5, 5a represent a diagnostic circuit; 11 to 14 are a comparator circuit; 15 indicates a reference voltage circuit; 16 to 18 are a judgement circuit; 19 to 22 indicate a resistor-input type filter circuit; 27 to 30 represent a capacitor-input type filter circuit; 23 to 26 indicate a holding circuit; symbol "C" is a signal processing capacitor; D1 to D19 are a signal processing diode; F is an overcurrent interrupting fuse; GND is a common ground line for a load drive apparatus; IC1 to IC5 are a comparator; LP, LP1, LP2 indicate a filament type lamp; MO is a DC drive type motor; OP represents an operational amplifier; Q is an NPN type power driving transistor; Q1, Q3, Q5, Q7 represent an NPN type signal processing transistor; Q2, Q4, Q6, Q8 indicate a PNP type signal processing transistor; Q9, Q10 represent an NPN type relay driving transistor; R is a current detecting resistor; R1 to R54 indicate a signal processing resistor; RL1, RL2 are a coil of a relay for driving a changing circuit; S1, S2, S2a, S2b are a changing circuit for a relay; and, V represents a positive power source terminal which is applied via an ignition key switch (not shown).

Referring now to FIGS. 1 to 4, circuit arrangements will be described. An operation signal "f" supplied from a CPU (not shown) is input into the control circuit 4. In response to this input value, a rectangular control signal "a" as illustrated in, for instance, FIG. 3a is supplied to the base of the transistor Q provided in the drive circuit 3. This control signal "a" represents a time period during which power is supplied to the load 1 series-connected to this transistor and power supply apparatus (not shown), or a current value.

To the emitter of this transistor Q, one end of the resistor R in the current detecting circuit 2 is connected so as to detect the current flowing through the lamp LP as the load 1. The other end of this resistor R is connected to one end of the lamp LP, and the other end of this lamp LP is grounded.

One end of the resistor R43 is connected to a junction between the resistor R of this current detecting circuit 2 and the emitter of the transistor Q. The other end of the resistor R4 is connected via the resistor R44 to the ground line GND. One end of the resistor R45 is connected to a junction between the resistors R43 and R44 constituting a voltage divider circuit, whereas the other end of the resistor R45 is connected to the non-inverting input (+) of the operational amplifier OP. This junction is connected via the resistor R46 to the ground line. To a junction between the resistor R and lamp LP, an anode of the diode D18 is connected in order to prevent the current from being flown from the current detecting circuit 2 to the load 1. To a cathode of this diode D18, one end of the resistor R47 is connected, whereas the other end of the resistor R47 is connected via the resistor R47 is connected via the resistor R48 to the ground line. One end of the resistor R49 is connected to a junction between the resistors R47 and R48 constituting this voltage divider circuit, whereas the other end of this resistor R49 is connected to an inverting input (−) of the operational amplifier OP. One end of the resistor R54 is connected to a common connecting point of the resistors R47, R48 and R49. This resistor R54 is to match the output voltage value of the operational amplifier OP to the judgement level of the diagnostic circuit 5 (will be discussed later). The other end of the transistor R54 is connected to the power source terminal V. The voltage divider circuit constructed by the resistors R43, R44, R47 and R48 is so designed that the voltage difference applied between both the input (+) and (−) of the amplifier OP is varied within a predetermined variation which is narrower than the maximum allowable input voltage width of both inputs (+) and (−) by a predetermined value. To a junction between the resistor R49 and the non-inverting input (−), one end of the resistor R50 for the negative feedback operation is connected. The other end of the resistor R50 is connected to the output of the amplifier OP. From the junction between the output of the operational amplifier OP and the resistor R50, the current detecting signal "b" corresponding to the voltage drop which is produced in accordance with the power supply value applied to both ends of the resistor R, is output within a predetermined level. When, for instance, the current value flowing through the load 1 is interrupted, this current detecting signal "b" with a "Lb" level shown in FIG. 3b is output. The condition of the "Lb"-leveled current detecting signal "b" exceeds over a "VD18" corresponding to the Zenor forward voltage of the diode D18. In addition, the voltage value produced by subdividing the power source voltage value V by the resistors R54 and R48 is continuously produced in such a manner that the load current exceeding over the voltage value applied to both ends of the current detecting resistor R can be flown.

To the common ground line GND, the negative polarity of the DC power source (car battery etc.) is connected, whereas the positive polarity terminal V is connected to the collector of the transistor Q. With the above-described circuit arrangement, the current can be flown through the power source, drive circuit 3, current detecting circuit 2 and lamp LP in this order.

The control signal "a" (see FIG. 3a) output from the control circuit 4 is designed, with respect to, for instance, the voltage value of the power source terminal "V", so as to be output at the "Ha" leveled voltage. This voltage can drive the maximum rated current (corresponding to the smaller value in the allowable element; simply referred to as a "rated current value") of this load drive circuit (namely, the series circuit constructed of the power supply (not shown), the collector-to-emitter path of the transistor Q functioning as the drive element of the drive circuit 3, and the lamp "LP" functioning as the load 1; simply referred to as a "load drive circuit"). This Ha-leveled value is obtained from the internal voltage value which is produced by to sufficiently increase the power source voltage "V" which has been applied to the control circuit 4 by the power source voltage increasing means (not shown) arranged in the internal circuit of the control circuit 4. This control signal "a" is also supplied to the diagnostic circuit 5, which is the same as the control signal supplied to the base of the transistor Q. Also, to this diagnostic circuit 5, both the current detecting signal "b" (see FIG. 3b) derived from the above-described current detecting circuit 2 connected between the emitter of the transistor Q (simply referred to as a "drive element" hereinafter) and the load 1, and also the voltage detecting signal "c" derived from the resistor R and lamp LP are output. This voltage detecting signal "c" is output as the "H"-leveled voltage value produced across the both terminals of the lamp LP from which the voltage value is subtracted. This voltage value is produced by subdividing the power source voltage "V" shown in FIG. 3c corresponding to the internal impedance of the lamp LP as the load 1, for instance, by the current detecting resistor and the internal impedances of the drive circuit 3 and power source apparatus (simply referred to as a "power source").

The control signal "a" input to this diagnostic circuit 5 is supplied, as shown in FIG. 3a1, via the voltage divider circuit constructed of the resistors R6 and R7 to the non-inverting input (+) of the comparator IC2 of the comparator circuit 12 in such a manner that the diode D1 is connected in the forward direction with respect to the control signal "a" with the anode and cathode.

One end of the resistor R1 is connected to the cathode of the diode D1, whereas the other end of the resistor R1 is connected via the resistor R2 to the ground, and also one end of the resistor R3 is connected thereto. From the common connecting point of the resistors R1, R2, R3, the control signal "a" subdivided to a predetermined level as illustrated in FIG. 3a2, is connected to one input terminal of the AND gate IC 6 as the judgement circuit 16 (will be discussed later).

To the other end of the resistor R3, the cathode of the diode D2 employed in the reference voltage circuit 15 is connected, and to the inverting input (−) of the comparator IC4 employed in the comparator circuit 14, the control signal "a" is directly input with the "L3" level shown in FIG. 3a3 as the reference judgement value for the "L" level case. Each of one ends of the resistors R4, R5 is connected to the anode of the diode D2, the other end of the resistor R4 is connected to the power source voltage V, the other end of the resistor R5 is connected to the ground line GND. A ratio of the resistance values of the resistors R4, R5 is preset in such a manner that a voltage can be produced, corresponding to the value of the voltage detecting signal "c" of the load drive circuit under the normal condition as the reference comparison value of the comparator circuit 14.

The current detecting signal b input into the diagnostic circuit 5 is supplied via the resistor R9 to the non-inverting input (+) of the comparator IC1 employed in the comparator circuit 11, and also via the resistor R8 to the inverting input (−) of the comparator IC2 employed in the comparator circuit 12 in order that the respective input impedances are prevented to be lowered less than a constant value.

The voltage detecting signal "c" input into the diagnostic circuit 5 is supplied via the resistor R13 to one input employed in the judgement circuit 17, and via the resistor R14 to the inverting input (−) of the comparator IC3 employed in the comparator 13, and also supplied via the resistor R17 to the non-inverting input (+) of the comparator IC4 employed in the comparator circuit 14 in order that the respective input impedances are not lowered below a constant value.

In the comparator 11, one ends of the resistors R10 and R11 are connected to the inverting input (−) of the comparator IC1, and the other end of the resistor R10 is connected to the power source terminal V and the other end of the resistor R11is connected to the ground line. A ratio of these resistance values of the resistors R10 and R11is set, corresponding to the current detecting signal "b" of the rated current value which is supplied via the resistor R9 to the non-inverting input (+) of the comparator IC1. When the current detecting signal "b" exceeding over this rated current value is input, the output comparator signal 11a of the comparator IC1 is transferred into the "H" level. The comparator signal 11a as the output of this comparator IC1 is directly supplied into another one input of the AND gate IC6 as the judgement circuit 16.

The judgement circuit 16 is so arranged while the comparator signal 11a having the "H" level is supplied the "H" level judgement signal 16a representative of the overcurrent malfunction condition is supplied to the filter circuit 19 if the current detecting signal b exceeds over the rated current value only when the control signal "a" is brought into such a condition that the "Ha" level signal (see FIG. 3a) is produced so as to supply power to the load 1. The voltage value applied to the AND gate IC6 in synchronism with the "Ha" level waveform of this control signal "a" has such a wave crest value, as shown in FIG. 3a2, that the voltage value obtained by subtracting the forward Zenor voltage VD1 of the Zenor diode D1 from the "Ha"-level value of the control signal "a" is divided by the resistors R1 and R2. This wave crest value "Ha2" is substantially equal to the "H"-leveled voltage value output from the comparator IC1, which can be recognized as the "H" level at the AND gate IC 6 (refer to a first formula). The voltage value applied to the AND gate IC6 in synchronism with the "L" level waveform in the control signal "a" has such a wave crest value as shown in "La" in FIG. 3a2 that with respect to the "GND" level, it is increased by dividing the output voltage of the reference voltage circuit 15 by the voltage divider circuit of the resistors R2 and R3. This wave crest value "La" is enough small to be recognized as the "L" level signal. The voltage value having the "La" level is a value obtained in the following way. The power source voltage V is first divided by the voltage divider circuit constituted by the resistors R4 and R5, and then, from the subdivided voltage value, the forward Zenor voltage VD2 of the diode D2 is subtracted, and furthermore it is obtained by dividing a combined resistor RX (will be discussed later) and the resistor R3 for constituting the voltage divider circuit in accordance with a third formula. It should be noted that the combined resistor value RX is set as shown in the second formula by the series circuit by the resistor R1 parallel-connected to the resistor R2, and the resistors R6 and R7:

$H2 = (Ha - VD1)[R2/(R1+R2)]$     first formula $RX = [R2(R1+R6+R7)/(R1+R2+R6+R7)]$     second formula $L2 = \{V[R5/(R4+R5)] - VD2\}[RX/(RX+R3)]$     third formula The filter circuit 19 is employed so as to eliminate a signal component whose repetition period is quicker than an unwanted predetermined period with respect to the variation ("L" to "H" to "L") of the desired judgement signal 16 input into the filter circuit 19. The input judgement signal 16a is coupled to one end of the resistor R19, and the other end of the resistor R19 is connected via the capacitor Cl to the ground line GND. The resistor R19 is so set that the output impedance of the AND gate IC6 is kept higher than a predetermine value. The time constant of the resistor R19 and also capacitor C1 is so set that the noise component of the signal having the period higher than a predetermined time period is eliminated. To the connecting point between the capacitor C1 and resistor R19, the anode of the diode D3 is connected, and the cathode thereof is so arranged that the signal is supplied as the output of the filter circuit 19 to the holding circuit 23. This diode D3 blocks the reverse current flowing from the input of the holding circuit 23 to the capacitor C1 so as to prevent the erroneous holding operation by the holding circuit 23. It should be noted that the below-mentioned filter circuits 20 to 22 are operated as same as with this filter circuit 19.

In the holding circuit 23, the "H"-leveled signal supplied from the filter circuit 19 via the resistor R23 is supplied to the base of the transistor Q1. A junction between this base and resistor R23 is connected via the resistor R24 to the ground line GND. The current value flowing through the base to emitter path of the transistor Q1 is limited to a predetermined value by the voltage divider circuit constructed of these two resistors R23 and R24. A voltage is applied from the power source terminal V via the series-connected resistors R26 and R25 to the collector of the transistor Q1. The emitter of this transistor Q1 is connected to the ground line GND. A junction between the resistors R26 and R25 is connected to the base of the transistor Q2 and the emitter thereof is connected to the power source terminal V. To the collector of this transistor Q2, the anode of the diode D7 is connected, whereas the cathode thereof is connected to the junction between the resistor R23 and the diode D3 of the filter circuit 19. As a result, when the "H" leveled signal is once input from the filter circuit 19, the current is flown through the collector-to-emitter path of the transistor Q1 via the resistors R26 and R25. At the same time, the base voltage of the transistor Q2 is lowered, the current is flown via the resistor R25 between the emitter-to-base path of the transistor Q2 and the collector to-emitter path of the transistor Q1. Then, the impedance between the emitter-to-collector path of the transistor Q2 is extremely lowered, and then, the base of the transistor Q1 becomes the "H" level via the diode D7 and the voltage dividing circuit of the resistors R23 and R24. This positive feedback condition can be maintained until the supply of the power to the power source terminal V is interrupted by operating the ignition key switch. To the junction between the collector of the transistor Q2 and the cathode of the diode D7, in conjunction with the output terminal of this holding circuit 23, the input for displaying the shortcircuit malfunction of the filter circuit 27 and the load 1 of CPU (not shown) is supplied as the display signal d2. It should be noted that the same functions of the holding circuits 24, 25, 26 can be expected.

The filter circuit 27 is so connected that in order to eliminate the noise component the repetition period of which is higher than an unwanted repetition period with respect to the variation speed of the holding signal ("L" to "H") output from the holding circuit 23, and to maintain that the resistor R39 series-coupled to the holding signal has a predetermined output impedance, one end of the capacitor C5 is connected thereto and the other end thereof is connected to the ground line GND. To the other end of this resistor R39, the anode of the diode D11 is connected and the cathode thereof is to prevent an interference of the operation of the holding circuit with respect to the outputs from the filter circuits 28, 29 and 30. Then, the cathode of the diode D11 is commonly connected with the outputs of other filter circuits 28, 29, 30, and thus the "H"-leveled feedback signal "e" representative of the malfunction condition (shortcircuit malfunction of the load 1) of the load drive circuit is supplied to the control circuit 4. Even if there are other conditions such as the open-circuit malfunction of the load 1 and drive circuit 3, and also the shortcircuit malfunction of the drive circuit 3, the "H"-leveled feedback signal "e" is similarly supplied to the control circuit 4, and the "H"-leveled control signal "a" is brought into the "L"-leveled control signal such that no power is supplied to the drive element. It should be also noted that the same functions of the below-mentioned filter circuits 28, 29 and 30 can be similarly expected.

The circuit arrangement of the comparator circuit 12 is so connected that the current detecting signal which has been applied via the resistor R8 to the inverting input (−) of the comparator IC2 is supplied thereto, and the control signal "a" supplied from the cathode of the diode D1 to the non-inverting input thereof is supplied thereto via the voltage dividing circuit constructed of the resistors R6 and R7, as illustrated in FIG. 3a1. To the junction between the resistors R6 and R7 constituting this voltage dividing circuit, both a "H1"-leveled voltage value and a "L1"-leveled voltage value (see FIG. 3a1) are alternately supplied. The first-mentioned "H1"-leveled voltage value is so set that with respect to the control signal "a", it is lower than, by a predetermined value, the "M"-leveled current detecting signal "b" indicated by a fourth formula, which is obtained by dividing a voltage value by the resistors R6 and R7, which is produced by subtracting the forward Zenor voltage VD1 of the diode D1 from the "Ha"-leveled control signal "a" as shown in FIG. 3a1. The second-mentioned L1-leveled voltage value is produced by a higher voltage value than a "0" volt of the common ground line GND by a voltage value obtained by applying the voltage from the reference voltage circuit 15 via the resistor R3 to the resistor R2 and subdividing it, said higher voltage being applied via the voltage divider circuit constructed of the resistors R6 and R7. This L1-level is not substantially influenced by the input impedances of the respective circuits IC2, IC4 and IC6, since the input impedances of the comparators IC2, IC4 and AND gate IC6 are set to be an extremely high value. Accordingly, the "L1"-leveled voltage value which is applied to the comparator circuit 12, is equal to a value. This value is substantially equal to the voltage value produced by subdividing the reference voltage by the combined resistor RX and resistor R3 constituting the voltage dividing circuit indicated by the above-described second formula. This reference voltage is equal to an output value of the voltage generating circuit 15 which is produced by subtracting the forward Zenor voltage $V_{D2}$ of the diode D2 from the subdivided voltage value produced by subdividing the power source voltage V from the resistors R4 and R5 constituting the voltage dividing circuit.

Then, to the non-inverting input (+) of the comparator IC2, a rectangular signal whose signal level is repeated between the "H1" and "L1" levels in synchronism with the "Ha" and "L" levels of the control signal "a" is supplied.

$$H1 = (Ha - VD1)[R7/(R6+R7)] \qquad \text{fourth formula}$$

$$L1 \approx \{V[R5/(R4+R5)] - VD2\}[RX/(RX+R3)][R7/(R1+R6+R7)] \qquad \text{fifth formula}$$

In other words, when the control signal "a" is at the "L" level, the "L1" levels higher than the zero voltage of the ground line GND by a predetermined value to the non-inverting input (+) of the comparator IC2. At the same time, the "Lb"-leveled current detecting signal "b" is supplied to the inverting input (−) of the comparator, which, as indicated by FIG. 3b, has been set by the resistors R54 and R48, and been higher than the "L1" level by a predetermined value. In this case, the comparator signal 12a is output at the "L" level. Then, when the voltage detecting signal "b" applied to the inverting input of the comparator exceeds over the "L1" level, the comparator signal 12a is output at the "H" level. When the control signal "a" is at the "Ha" level, the "H1" level voltage is applied to the noninverting input (+), which has been set to the level slightly lower than the minimum value of the load current to be supplied to the load drive circuit and lower than the current detecting signal "b" as represented by the "M" level in FIG. 3b. At the same time, the voltage indicated by a "M" level of FIG. 3b lower than the power source voltage V is applied to the inverting input (−), whereas the current detecting signal "b", indicated by a "H4" level of FIG. 3b, higher than the "H1" level is supplied to the non-inverting input (+). In this case, the comparator signal 12a is output at the "L" level. Then, at this time, when the current detecting signal "b" supplied to the inverting input (−) during the load open malfunction is lower than the "H" level, the comparator signal 12a with the "H" level is output to indicate that no power is supplied to the load drive circuit.

The above-described voltage relationship is arranged such that the voltage levels are from Ha>V>H4>M>H1>Lb>L1>GND in the high voltage order. This comparator IC2 for continuously performing the comparison operation will output to the judgement circuit 17, the comparator signal 12a having the "H" level representative of the condition that no power is supplied to the load drive circuit when the control signal "a" becomes the "Ha" level.

In the two-input terminal type AND gate IC7 of the judgement circuit 17, the output terminal of the comparator circuit 12a is directly connected to one input terminal of this AND gate so that the comparator signal 12a is supplied thereto, whereas the voltage detecting signal "c" is supplied via the resistor R13 to the other input terminal of this AND gate. Then, when both inputs are input at the "H" levels, the judgement signal 17a representative of such a fact that the load 1 is brought into the open-circuit malfunction condition is supplied via the filter circuit 20 to the holding circuit 24.

In the holding circuit 24, when the "H"-leveled signal from the filter circuit 20 is once input thereto, the display signal d3 having the "H" level indicative of the open-circuit malfunction condition of the load 1 is continuously supplied to CPU, and the feedback signal "e" having the same signal level as the "H"-leveled display signal is continuously output to the control circuit 4.

In the comparator circuit 13, the non-inverting input (+) of the comparator IC3 is directly connected to a common connection point where one end of the resistor R15 is connected to one end of the resistor R16, the other end of the resistor R15 is connected to the power source terminal V, and the other end of the resistor R16 is connected to the ground line GND so as to obtain the comparison reference voltage. The voltage detecting signal "c" is supplied via the resistor R1 to this inverting input (−). The comparison reference voltage value obtained by dividing the power source voltage V by the resistors R15 and R16 is so set that it slightly exceeds over the zero voltage of the ground line GND which contains the fluctuations of the inherent resistance values for the wires of the load drive circuit, and the hysteresis of the comparison value belonging to the comparator IC3. When the voltage detecting signal "c" becomes lower than the comparison reference value, this comparator circuit 13 supplies the "H"-leveled comparator signal 13a to the judgement circuit 18, which represents that no power source voltage is applied to the load 1.

In the AND gate IC8 functioning as the judgement circuit 18, only when both the comparator signals 12a and 13a output from the comparator circuits 12 and 13 are simultaneously at the "H" levels and input into two inputs of the AND gate IC8, the "H"-leveled judgement signal 18a is supplied via the filter circuit 21 to the holding circuit 25, which represents the failure conditions such that the circuit of the drive element is brought into the malfunction, in other words, the circuit is interrupted, burned out, or destroyed.

In the holding circuit 25, when the "H"-leveled signal from the filter circuit 21 is once input, the "H"-leveled display signal "d1" representing that the circuit of the drive element is opened is continuously output to the CPU, and also the feedback signal "e" having the same "H" level is continuously supplied via the filter circuit 29 to the control circuit 4.

To the non-inverting input (+) of the comparator IC4 employed in the comparator circuit 14, the voltage detecting signal "c" is applied via the voltage divider circuit constructed of the resistors R17 and R18. To this inverting input (−), the control signal "a" which has been converted into the crest values as illustrated in "H3" and "L3" of FIG. 3a3 is supplied. The "H3"-leveled voltage value supplied in synchronism with the "Ha"-leveled control signal "a" is supplied via the resistor R3 in such a manner that the voltage lower than the "Ha"-leveled control signal "a" by the forward Zenor voltage $V_{D1}$ of the diode D1 is subdivided by the resistors R1 and R2 constituting the voltage divider circuit. Since the input impedance of the comparator IC4 is set to be extremely high, the above "H3"-leveled voltage signal "a" can be supplied without receiving any influences caused by the resistors R1, R2 or the like connected to the resistor R3 (see a sixth formula). The voltage level "L3" applied in synchronism with the "L" level of the control signal "a" is set to be higher than the "GND" level which is a value (see a seventh formula) obtained by subdividing the power source voltage V applied from the voltage generating circuit 15 by the resistors R4 and R5 and thereafter subtracting it from the forward Zenor voltage $V_{D2}$ of the diode D2.

$$H3 \approx (Ha - VD1)R2/(R1 + R2)] \qquad \text{sixth formula}$$

$$L3 = V[R5/(R4 + R5)] - VD2 \qquad \text{seventh formula}$$

Even when the voltage detecting signal "c" supplied to this voltage divider circuit is equal to the power source voltage value V, the voltage dividing ratio of the resistor R17 to the resistor R18 is so set not to exceed over the "H3" level applied to the inverting input (−), as represented in an eighth formula.

$$V[R17/(R17 + R18) < H3 \qquad \text{eighth formula}$$

Then, when the "L3" level is supplied from this comparator 14 to the inverting input (−) in synchronism with the "L" level within the control signal "a", if the voltage applied to the non-inverting input (+) exceeds over this "L3" level, the "H"-leveled comparator signal 14a representative of the shortcircuit failure of the drive element is output via the filter circuit 22 to the holding circuit 26 although the control signal "a" is equal to the "L" level.

In the holding circuit 26, when the "H"-leveled signal from the filter circuit 22 is once input thereinto, the "H"-leveled display signal "d4" representing that the drive "d4" representing that the drive element is short-circuited is output to the CPU, and also the feedback signal "e" having the same "H" level is output via the filter circuit 30 to the control circuit 4.

The control circuit 4 into which the "H"-leveled feedback signal "e" from the diagnostic circuit 5 is input, outputs the "L"-leveled control signal "a" by which no power can be supplied to the drive circuit 3 under the condition that the operation signal "f" from the CPU (not shown) for supplying the power to the load 1 has been input.

Operations of the above-described circuit arrangement will now be explained.

First, while both the load 1 and drive circuit 3 are operated in the normal condition, three following signals are supplied to the diagnostic circuit 5. That is, the control signal "a" having the "L" (GND) level and "Ha" level derived from the control circuit 4, the current detecting signal "b" having the repeated levels "Lb" and "M" supplied from the detecting circuit 2 in synchronism with the control signal "a", and the voltage detecting signal "c" having the repeated levels "L" (GND) and "H" and applied between both ends of the load 1 in synchronism with the current detecting signal "b" are supplied to the diagnostic circuit 5.

In the diagnostic circuit 5 into which these three signals a, b, and c have been input, the following series of the diagnostic operation will be carried out.

That is to say, in the comparator circuit 11 into which the current detecting signal "b" having the "Lb" and "M" level is input, and in which this current detecting signal "b" does not exceed over a threshold value as the reference comparison value which has been previously set by the normal operating condition, it is recognized that the load current is below the rated current value, and the "L"-leveled comparator signal 11a is output. In the judgement circuit 16 into which this comparator signal 11a is input, this comparator signal is judged with all of the control signals and therefore, the "L"-leveled judgement signal 16a is supplied via the filter circuit 19 to the holding circuit 23. As a consequence, in the holding circuit 23, the current value supplied to the load 1 is maintained under the condition of the "L"-leveled display signal "d2" representative of the condition less than the allowable maximum current.

Under the signal level condition which is supplied to both the input terminals of the comparator circuit 12, and corresponds to the control signal "a" and current detecting signal "b" under the normal operation condition, both the "L1" level and the "H1" level voltages supplied to the non-inverting input (+) of the comparator circuit 12 exceed over the "M" level and "Lb" level of the current detecting signal "b" which has been supplied to the inverting input (−) in synchronization with the above voltages.

As a result, the comparator signal 12a supplied from the comparator signal 12a and output to the judgement circuit 17 is maintained under the "L"-leveled condition representing that the load current higher than the predetermined value is flown to the load drive circuit. In the judgement circuit 17 into which the voltage detecting signal "c" having the repeated level from "GND" (a zero volt) to "H" under the normal operating condition has been supplied in synchronism with the variations in the "L" and "Ha" levels of this comparator signal 12a and control signal "a", when the "H"-leveled voltage detecting signal "c" is applied to the load 1, in other words, when the voltage applied to the load 1 is below a desired value, it is judged that the power is supplied to the load drive circuit in accordance with the "L"-leveled control signal "a". Then, in the holding circuit 24 into which the judgement signal 17a maintaining the "L" level and supplied from the judgement circuit 17 has been supplied via the filter circuit 20, the display signal d3 is continuously held with the "L" level which represents that the load current higher than a predetermined value is flown through the load 1. Also, the feedback signal "e" is supplied from the hold circuit 24 via the filter circuit 28 with keeping the "L" level.

In the comparator circuit 13 under the normal operating condition, the following two conditions are repeated such that the "H"-leveled voltage detecting signal "c" which has been supplied via the resistor R14 to the non-inverting input (−) in synchronism with the "H"-leveled control signal "a" exceeds over the threshold value corresponding to the comparator reference value which has been continuously supplied to this non-inverting input (+) of this comparator circuit 13 and is set by the resistors R15 and R16, and also the "L" level (i.e., "GND" level) of the voltage detecting signal "c" which has been supplied via the resistor R14 to the inverting input (−) thereof in synchronism with the "L" level of the control signal "a" becomes lower than this threshold value. Then, the comparator signal 13a is output from this comparator circuit 13. The signal level of this comparator signal 13a is such that both the "H" level in synchronism with the "Ha" level of the control signal "a", and the "L" level in synchronism with the "L" level of the control signal "a" are repeated.

In the judgement circuit 18 into which this comparator signal 13a and the comparator signal 12a having the repeated level of "L" and "H" in this order are supplied from the comparator circuit 12, since there is the "H"-leveled input condition at the same time (specifically, when corresponding to the "Ha" level of the control signal "a", the "L"-leveled condition of the comparator signal 12a representing that the load current higher than a predetermined value is flown), it is judged the power is supplied from the drive element to the load 1 in response to the control signal "a", and the "L"-leveled judgement signal 18a is maintained. As a result, since the output from the judgement circuit 18 is kept at the "L"-leveled output condition, i.e., is not changed, the input signal to the holding circuit 25 even through the filter circuit 21 is not held at the H level, but the display signal d1 having the "L" level condition is continuously maintained.

In the comparator circuit 14 having the non-inverting input (+) into which the voltage detecting signal "c" having the repeated "GND" ("L") level and "H" level has been supplied in synchronism with the control signal "a" under the normal operating condition via the voltage dividing circuit of the resistors R17 and R18, both the "L3" and "H3" level values which are changed in synchronism with the control signal "a" supplied to the inverting input (−) thereof do not exceed over the value applied to the non-inverting input (+) based upon the voltage detecting signal "c". As a consequence, from the comparator circuit 14, the "L"-leveled comparator signal 14a is continuously output by judging that the drive element interrupts the current flown based upon the "L" level of the control signal "a". Then, since the output from the comparator circuit 14 is not varied with keeping the "L"-leveled output condition, the signal level of the holding circuit 26 is not held at the "H" level even if it is passed through the filter circuit 22, and therefore the output condition of the "L"-leveled display signal "a4" is continuously output.

Then, in the control circuit 4 into which the feedback signal "e" having the "L" level and the display signal "d2" are input respectively, and the CPU, both the instruction operation for instructing the operation signal "f" to the load 1 to the designated value and continuously supplying the power to the load 1 for a predetermined time period, and also the displaying operation condition for displaying the normal condition of the load 1 are maintained.

Thereafter, in the shortcircuit failure conditions where both ends of the load 1 are brought into the extraordinarily low impedance by reason of, for instance, the internal and outer wirings, the current detecting signal "b" having the extraordinary value is output from the detecting circuit 2, and also the voltage detecting signal "c" is output, in which the voltage value across the load 1 becomes the "GND" level condition substantially equal to a zero volt. Under this condition, the current detecting signal "b" is input, as shown in the waveform chart during the shortcircuit of the load in FIG. 3b, with having such rectangular waveforms of the "Lb" level in synchronism with the "L" and "Ha" levels of the control signal "a", and also of the "H4" level (see the shortcircuited load of FIG. 3b) exceeding over the rated current value of the load drive circuit. As indicated in the waveform chart during the shortcircuit of the load in FIG. 3c, the voltage detecting signal under this condition is input with having such a waveform which does not substantially change at the level extremely close to the "GND" level. In the diagnostic circuit 5 into which one pair of these detecting signals "b" and "c", and the control signal "a" output at this time, the following series of the diagnostic operation is performed.

That is, in the comparator circuit 11 into which the current detecting signal "b" (the value denoted by "H4" in FIG. 3b, as one example) exceeding over the rated current value of the load drive circuit under the load shortcircuit failure condition is input, the overcurrent condition is recognized as if this signal level exceeds over the threshold value corresponding to the reference comparison value preset by the resistors R10 and R11, and accordingly the "H"-leveled comparator signal 11a is output. In the judgement circuit 16 to which this comparator signal 11a has been supplied, the recognition is made that this overcurrent condition corresponds to the supply condition of the "H2" leveled control signal "a" (see FIG. 3a2) for supplying the power to the load 1. Then, the "H"-leveled judging signal 16a is supplied from the judgement circuit 16 via the filter circuit 19 to the holding circuit 23. As a result, in the holding circuit 23, the display signal d2 representing the shortcircuit malfunction condition where the overcurrent is flown through the load 1 is transferred to the "H" level and continuously held therein. At the same time, for the feedback signal "e" appearing at the common connecting point among the respective filter circuits 27, 28, 29 and 30, the "H"-leveled output signal from the holding circuit 23 is continuously output via the filter circuit 23 to the control circuit 4.

Under the signal levels of the signals supplied to both the input terminals of the comparator circuit 12, which correspond to the control signal "a" and the current detecting signal "b" representative of the load shortcircuited condition, the voltage of the current detecting signal "b" which is applied via the resistor R8 to the inverting input (−) thereof and has the two repeated conditions at the "H4" level and "Lb" level in synchronism with the "H1" and "L1" levels, exceeds over the voltage value which has been applied to the non-inverting input (+) thereof and the two repeated conditions of the "H1" level and "L1" level. As a consequence, the comparator signal 12a output from the comparator circuit 12 to the judgement signal 7 is maintained at the "L" level condition representing that the power is supplied to the load 1, drive element, and power supply loop. In the judgement circuit 17 which includes the comparator 12a and the voltage detecting signal "c" ("GND" level) produced when the load 1 is brought into the shortcircuit malfunction condition, it is recognized that the "H"-leveled input signals are simultaneously supplied thereto. As a result, in the holding circuit 24 into which the judgement signal 17a having no change in its "L" level supplied from the judgement circuit 17 under this condition, and representing that the load 1 has the impedance lower than a predetermined value, has been supplied via the filter circuit 20, it is not held at the "H" level, but the display signal "d3" having the "L" level condition is continuously maintained.

In the comparator circuit 13 where the value based on the voltage detecting signal "c" under the load shortcircuit malfunction condition is applied to the inverting input (−), it is recognized that the voltage to be applied to the load 1, which is lower than the reference comparison value set by the resistors R15 and R16 and previously applied to the non-inverting input (+), becomes the extremely low load voltage condition, and then the "H"-leveled comparator signal 13a is output. In the judgement circuit 18 into which this comparator signal 13a and the above-described "L"-leveled condition, it is judged that the power is supplied from the drive element to the load, and therefore the "L"-leveled judgement signal is maintained. As a result, the output condition of the output signal from the judgement circuit 18 is not changed, and in the holding circuit 25, the signal level is not held into the "H" level even if it is supplied via the filter circuit 21 and thus, the output condition of the "L"-leveled display signal d1 is continuously maintained.

In the comparator circuit 14, based upon the control signal "a" produced under the load shortcircuit malfunction and the voltage detecting signal "c", the "L" (GND)-leveled voltage detecting signal "c" supplied to the non-inverting input (+) does not exceed over the "L3" level shown in FIG. 3a3 which corresponds to the "GND" level of the control signal "a" supplied to the inverting input (−), by which the supply of the power to the load 1 is stopped. As a result, the comparator circuit 14 recognizes that the drive element interrupts the current in response to the "L"-leveled control signal "a", and continuously outputs the "L"-leveled comparator signal 14a. Then, since the "L"-leveled output from the comparator circuit 14 is not changed, the level of this signal received even via the filter circuit 22 is not held into the "H" level, and therefore the output condition of the "L"-leveled display signal "d4" is maintained.

Then, in the control circuit 4 and CPU into which the "H"-leveled feedback signal "e" and display signal "d" are supplied respectively, both the instruction operation for cancelling the supply of the power to the load 1 caused by the operation signal "f", and the display operation for displaying the shortcircuit failure condition of the load 1 are continued until the power source is turned off by the ignition key switch.

Subsequently, when the open-circuit malfunction condition occurs, namely, for instance, the impedance of the load 1 measured at both ends thereof becomes extremely high due to occurrences of the circuit interruption, or disconnection of the connector, the "Lb"-leveled current detecting signal "b" representing that the current value becomes extraordinarily low such as the current interruption is output from the current detecting circuit 2. In addition, such a voltage detecting signal "c" is output that between the junction of the current detecting circuit 2 and load 1, and the ground line GND, both the "GND" level ("0" volt, "L") and the "V" level substantially equal to the voltage value at the power source terminal V are applied in synchronism with the control signal "a". In the diagnostic circuit 5 into which one pair of detecting signals "b" and "c", and the control signal "a" output at this moment have been supplied, the following series of the diagnostic operation is carried out.

That is, in the comparator circuit 11 into which the "Lb"-leveled current detecting signal "b" has been input, that does not exceed over the threshold value, i.e., the reference comparison value preset by the resistors R10 and R11 in case of the load-open malfunction condition, it is recognized that the load current below the allowable current value is flown, and the "L"-leveled comparator signal 11a is output. In the judgement circuit 16 into which this comparator signal 11a has been input, this power supply condition and all of the control signals "a" are judged and the "L"-leveled judgement signal 16a is supplied via the filter circuit 19 to the holding circuit 23. Consequently, the signal condition of the "L"-leveled display signal "d2" is maintained in the holding circuit 23, which indicates that the current value supplied to the load 1 is less than the allowable maximum current value.

In the comparator circuit 12 into which both the control signal "a" produced during the load open failure condition and the current detecting signal "b" have been input, the value of the current detecting signal "b" which is not changed at the "Lb" level, and supplied to the inverting input (−) thereof exceeds over the "L1" level supplied to the non-inverting input (+) thereof and is lower than the "H1" level. As a result, the comparator signal 12a output to the judgement circuit 17 is changed from the "L" level to the "H" level in synchronism with the control signal "a". This "L" level represents the open-circuit failure condition under which when the control signal "a" is equal to the "Ha" level the current value supplied to the load drive circuit is less than a predetermined value. Then, in the judgement circuit 17 into which this comparator signal 12a and the voltage detecting signal "c" which is in synchronism with the control signal "a" at the V level as the extraordinarily high power source voltage value with respect to the "GND" level ("0" volt, "L") applied between both ends of the load 1, have been supplied, it is recognized that both input signals have simultaneously the "H" levels with each other. As a consequence, in the holding circuit 24 into which the judgement signal 17a having the repeated levels of "L" and "H" has been supplied via the filter circuit 20 in synchronism with the control signal "a" from the judgement circuit 17, the input signals are transferred into the "H" level representing that the load 1 is brought into the open-circuit malfunction condition, and the display signal "d3" is continuously maintained Also, the feedback signal "e" is transferred from the holding circuit 24 via the filter circuit 28 into the H level, and continuously held.

In the comparator circuit 13 where in synchronism with the control signal "a" produced based upon the voltage detecting signal "c" during the load-open failure condition, the signal having the repeated signal level between the "GND" ("0" volt, "L") level and "V" level has been supplied to the inverting input (−), the "GND" ("L") level is lower than the threshold value applied to the non-inverting input (+) as the reference comparison value preset by the resistors R15 and R16, and the "V" level exceeds over this threshold level. As a result, such a condition that the extraordinarily high voltage is applied to the load 1 in synchronism with the control signal "a" is recognized, and then, the comparator signal 13a having the repeated level of the 13. In the judgement circuit 18 into which this comparator signal 13a and the above-described comparator signal 12a having the repeated signal level between the "L" and "H" levels from the comparator circuit have been input, since both the input signals are not at the "H" level it can be judged that the power is supplied from the drive element to the load 1 based upon the control signal "a", and thus the "L"-leveled judgement signal 18a is maintained. As a consequence, since the output from the judgement circuit 18 does not change its output condition, i.e., keeps its "L" level, the holding circuit 25 does not hold the "H" level even if it is supplied via the filter circuit 21, and the output condition of the "L"-leveled display signal "d1" is maintained continuously.

In the comparator circuit 14 where the value obtained via the voltage divider circuit constructed of the resistors R17 and R18, based upon the voltage detecting signal "c" having the "GND" ("0" volt, "L" and "V" levels which are varied in synchronism with the control signal "a" generated during the load open failure condition, is supplied to the non-inverting input (+), since the value having the repeated levels of "L3" and "H3" in synchronism with the control signal "a" and supplied to the inverting input (−) does not exceed over the value produced based upon the voltage detecting signal "c" and supplied to the non-inverting input (+), it interrupts the current produced based upon the "L"-leveled control signal "a", and thus, the comparator signal 14a having the "L" level is continuously output. Then, since the "L"-leveled output condition of the output from the comparator circuit 14 is not changed, the "H" level of the signal is not held in the holding circuit 26 even if it is supplied via the filter circuit 22, and also the output condition of the "L"-leveled display signal d4 is maintained.

When the transistor Q of the drive circuit 3 is opened, e.g., the impedance of this transistor Q becomes extremely high, the "Lb"-leveled current detecting signal "b" is output from the detecting circuit 2, which represents the condition that the extremely low current value such as in case of the current interruption is flown. Also, from the terminal close to the power source terminal V of the load 1, the voltage detecting signal "c" having substantially no change in its "GND" level is output. In the diagnostic circuit 5 into which one pair of these detecting signals "b", "c" and the control signal "a" output at this time have been input, a series of diagnostic operation will be performed as follows.

In the comparator circuit 11 into which the "Lb"-leveled current detecting signal "b" has been input which does not exceed over the threshold value as the reference comparison value preset by the resistors R10 and R11 during the open-circuit malfunction of the drive circuit, it is recognized that the power less than the allowable value is supplied, and then the comparator signal 11a having the "L" level is output. In the judgement circuit 16 into which this comparator signal 11a has been input, this power supply condition and all of the control signals "a" are judged, and the judgement signal 16a with the "L" level maintained is supplied via the filter circuit 19 to the holding circuit 23. As a consequence, in the holding circuit 23, the condition of the "L"-leveled display signal "d2" is maintained which represents that the current value flowing through the load 1 is below the allowable maximum current.

In the comparator circuit 12 into which the control signal "a" produced during the open-circuit malfunction of the drive circuit and the current detecting signal "b" have been input, the voltage value of the current detecting signal "b" supplied to the inverting input (−) and having no level change, i.e., the "L" level, exceeds over the "L1" level and is lower than the "H1" level. As a result, the signal level of the comparator signal 12a which is output to the judgement circuit 17 at this time, is repeatedly varied in synchronism with the control signal "a" in the order of the "L" level and "H" level. This "L" level signal represents such a condition that the value of the current flowing through the load drive circuit while the control signal "a" has the "Ha" level is lower than a predetermined value, i.e., the open-circuit malfunction condition. The "H" level indicates such a condition that the load current while the control signal "a" is equal to the "L" level is interrupted. In the judgement circuit 17 into which this comparator signal 12a and the voltage detecting signal "c" have been supplied, the signal level of which voltage detecting signal does not change substantially, but has the "GND" ("0" volt; "L") level applied across both ends of the load 1, it is recognized that both input signals do not have simultaneously the "H" level with each other. As a consequence, in the holding circuit 24 where the judgement signal 17a from the judgement circuit 17 representing that the power is predetermined impedance, is supplied via the filter circuit 20, the signal level of the display signal d3 is not continuously held at the "H" level, but at the "L" level.

In the comparator circuit 13 where the value having the "GND" ("0" volt, "L") level produced during the opencircuit malfunction condition of the drive circuit, has been applied to the inverting input (−), it is recognized that the "GND" ("L") level of the value supplied to the inverting input (−) is below than the threshold value as the reference comparison value previously preset by the resistors R15 and R16 and supplied to the non-inverting input (+). As a result, from the comparator circuit 13, the comparator signal 13a is output that represents the voltage applied to the load 1 whose level does not change, i.e., at the "H" level is less than a required value. In the judgement circuit 18 into which this comparator signal 13a and the comparator signal 12a from the comparator circuit 12 having the above-described repeated levels of "L" and "H", have been input, both of these comparator signals have simultaneously the "H"-leveled input conditions, so that it is judged that no power is supplied from the drive element to the load 1 based upon the control signal "a", and thus the judgement signal 18a having the repeated level between "L" and "H" levels in this order is output. As a consequence, in the holding circuit 25 into which the output signal from the judgement circuit 18 changed into the "H" level has been supplied via the filter circuit 21, the display signal "d1" having the "H" level is continuously maintained, which represents that the drive element is brought into the open-circuit failure condition with keeping the "H" level.

In the comparator circuit 14 where based upon the voltage detecting signal "c" having the "GND" ("0" volt, "L") level produced during the open-circuit failure condition of the drive circuit, the "GND" level of which is not changed, the value is supplied to the non-inverting input (+) via the voltage divider circuit constructed of the resistors R17 and R18, since the value having the repeated level between "L3" and "H3" supplied to the inverting input (−) in synchronism with the control signal "a" is not below than the value supplied to the non inverting input (+) and produced based upon the voltage detecting signal "c", it is recognized that the drive element interrupts the current produced based on the "L"-leveled control signal "a", so that the "L"-leveled comparator signal 14a is continuously output. Then, since the "L"-leveled output condition of the output from the comparator circuit 14 is not changed, the input signal level of the holding circuit 26 is not held to the "H" level even if it is supplied via the filter circuit 22, and the output condition of the "L"-leveled display signal "d4" is continuously maintained.

Next, under the shortcircuit malfunction condition where because the transistor Q of the drive circuit 3 represents the extraordinarily low impedance due to, for instance, the electrostatic destruction or the like, the power control cannot be performed in response to the control signal "b" is output from the detecting circuit 2, which has the "M" level representative of the extraordinarily long power supply condition with respect to the time period during which the current should be interrupted, and also the voltage detecting signal "c" having no change in the "H" level and supplied to the load 1 whose condition is substantially equal to the rated condition is output. In the diagnostic circuit 5 into which one pair of these detecting signals "b" and "c", and the control signal "a" output at this time have been input, a series of diagnostic operation will be carried out as follows.

That is to say, in the comparator circuit 11 into which the current detecting signal having the "M" level has been input, which does not exceed over the threshold value as the reference comparison value previously set by the resistors R10 and R11 during the shortcircuit malfunction condition of the drive circuit, it is recognized that the power smaller than the allowable value is supplied, and thus the "L"-leveled comparator signal 11a is output. In the judgement circuit 16 into which this comparator signal 11a has been input, this power supply condition and the value in accordance with all of the control signals "a" are judged, so that the judgement signal 16a with the "L" level whose level is not varied is supplied via the filter circuit 19. As a result, in the holding circuit 23, the condition of the "L"-leveled display signal "d2" is maintained which represents that the current value supplied to the load 1 is below the allowable maximum current.

In the comparator circuit 12 into which both the control signal "a" and current detecting signal "b" produced during the shortcircuit malfunction condition of the drive circuit have been input, the value of the current detecting signal "b" having the "M" level and supplied to the inverting input (−) exceeds over both the "L1" level and "H1" level supplied to the non-inverting input (+). As a consequence, the comparator signal 12a output to the judgement circuit 17 is not varied with the "L" level for representing that the current value supplied to the load drive circuit when the control signal "a" is at the "H" level becomes higher than a predetermined value. In the judgement circuit 17 into which both this comparator signal 12a and the voltage detecting signal "c" supplied between both ends of the load 1 and having substantially no level change, i.e., the "H" level have been supplied, the recognition is made that both the input signals have not simultaneously the "H" level with each other. As a result, in the holding circuit 24 into which the judgement signal 17a is supplied via the filter circuit 20, which is derived from the judgement circuit 17 with keeping the "L" level, and represents that the power is supplied to the load 1 under the condition that its impedance is smaller than a predetermined impedance, the level of the input signal is not held at the "H" level, but the display signal "d3" having the "L"-leveled condition is continuously maintained.

In the comparator circuit 13 where the value having the "H" level produced by the voltage detecting signal "c" during the shortcircuit failure condition of the drive circuit is supplied to the inverting input (−), the recognition is made that this "H" level is lower than the threshold value as the reference comparison value previously set by the resistors R15 and R16 and supplied to the non-inverting input (+), and therefore, the comparator signal 13a representing that the voltage which is not changed at the "L" level and applied to the load 1 is higher than a predetermined value. Then, in the judgement circuit 18 into which this comparator signal 13a and the comparator signal 12a having the "L"-leveled condition, derived from the comparator circuit 12 have been input, since both the input signals simultaneously do not have the "H" levels with each other, it is judged that the power is supplied from the drive element, and thus the judgement signal 18a which is not changed under the "L"-leveled condition is output. As a consequence, in the holding circuit 25 into which the output having the "L" level has been supplied from the judgement circuit 18 via the filter circuit 21, the display signal "d1" having the "L" level condition is continuously maintained, which represents that the drive element not held at the "H" level supplies the load current below the rated current value to the load 1.

In the comparator circuit 14 where the value produced based upon the voltage detecting signal "c" which is not varied at the "H" level during the shortcircuit failure condition of the drive circuit has been applied via the voltage divider circuit constructed of the resistors R17 and R18 to the non-inverting input (+), the value supplied to the non-inverting input (+) based upon the voltage detecting signal "c" exceeds over the "L3" level in synchronism with the control signal "a" supplied to the inverting input (−), and is below the "H3" level. As a result, it is recognized that the drive element does not interrupt the current based upon the "L" level of the control signal "a", so that the comparator signal 14a having the repeated levels between the "H" and "L" in this order is output from the comparator 14. Then, in the holding circuit 26 into which the "H"-leveled output has been supplied via the filter circuit 22, the output derived from the comparator circuit 14 is held at the "H" level, and the display signal "d4" indicating that the drive circuit 3 is brought into the shortcircuit failure condition is continuously output.

It should be noted that for the sake of convenience, the waveforms of the respective malfunction conditions within the current and voltage detecting signals "b" and "c" illustrated in FIG. 3 are illustrated under the condition that the feedback signal "e" to the control circuit 4 has not yet been supplied.

A series of the respective operation conditions previously described are mentioned in the operation list of FIG. 4.

The above-described diagnostic circuit 5 includes a judging means for judging the below-mentioned four conditions. That is, a shortcircuited load judging means will judge that the load 1 is brought into the shortcircuit condition based upon both the control signal "a" when the power should be supplied to the load 1, and the comparator signal 11a when the load current exceeds over the rated current value. A open-circuited load judging means will judge that the load 1 is brought into the open-circuit condition based upon the comparator signal 12a representing that no power is supplied when the power should be supplied to the load 1, and the higher voltage value "c" being applied to the load 1 at this time. A open-circuited drive circuit judging means will judge that the drive circuit 3 is brought into the open-circuit condition based upon the comparator signal 13a representing that the voltage applied to the load 1 is lower than the threshold value, and also the comparator signal 12a indicating that no power is supplied when the power should be supplied to the load 1. Then, a shortcircuited drive circuit judging means will judge that the drive circuit 3 is brought into the open-circuit condition based upon both the control signal "a" representing that no power should be supplied to the load 1, and also the comparator signal 14a representing that the voltage applied to the load 1 at this time is higher than the threshold value For the sake of convenience, these four judging means were mainly arranged by the comparators IC1 to IC4 and AND gates IC6 to IC8. However, the similar judgement operation can be achieved even if these signals are digital-processed in the time sharing process based upon the voltage and current values which have been received via an A/D port of a microcomputer, for instance. In the above-described diagnostic circuit, the voltage of the input control signal "a" was set by the passive elements such as the voltage divider circuit. Alternatively, this set value may be set via an operational amplifier.

Referring now to FIG. 5, a load controlling apparatus will be described. It should be noted that the same and relevant reference numerals of the prior art and the above-described preferred embodiments will be employed for denoting the same or similar circuit components or functioning portions in this figure, and therefore the descriptions thereof are omitted.

One end of a motor "MO" as the load 1 is connected to the power source terminal V, whereas the other end thereof is connected to the current detecting circuit 2. Then, the voltage detecting signal "c" is equal to a voltage detecting value which is voltage-devided by the current detecting circuit 2 and drive circuit 3. In the diagnostic circuit 4a into which this voltage detecting value has been applied, it is calculated a value which is produced by subtracting this voltage detecting value from the power source voltage V and is voltage-devided by the load 1. Then, the diagnostic operation is carried out based upon this calculated value which corresponds to the voltage value subdivided at both the ends of the load, that has been calculated in response to the voltage detecting signal "c", which is similar to the diagnostic operation by the diagnostic circuit 4 as previously described in detailed with reference to FIGS. 1 to 4.

Next, a load controlling apparatus shown in FIG. 6 will now be explained. It should be noted the same and relevant reference numerals of the prior art and the above-described preferred embodiments will be employed for denoting the same or similar circuit components or functioning portions in this figure, and thus the descriptions thereof are omitted.

The voltage derived from the power source terminal V is connected to a switching circuit S2 in such a way that in the normal condition, this voltage is applied to the drive circuit 3, and to a fuse "F" in case of the failure condition of the drive circuit 3. To a junction between the other end of this fuse "F" and the drive circuit 3, the current detecting circuit 2 is connected. To the other end of the current detecting circuit 2, a lamp LP1 operable during the normal condition as the load 1a, and also a lamp LP2 operable as the spare load during an occurrence of the extraordinary condition are connected. Two other ends of these lamps are connected to a switch circuit S1, respectively, whereas a common terminal of this switch circuit S1 is grounded.

From a common connecting point between the loads 1a, 1b, and current detecting circuit 2, the voltage detecting signal "c" is supplied to a diagnostic circuit 5a. Also from the current detecting circuit 2, the current detecting signal "b" is supplied to the diagnostic circuit 5a.

In the control circuit 4a, the operation signal "f" is supplied to the non-inverting input (+) of the comparator IC5, and the feedback signal "e" derived from the diagnostic circuit 5a is supplied to an inverting input (−) thereof. Then, when the feedback signal is supplied at the "H" level, all of the output conditions are not changed at the "L" level.

The diagnostic circuit 5a outputs the display signals "d1" to "d4" to a CPU (not shown) respectively. Each of anodes of diodes D15, D16 for preventing a signal interference is connected to output terminals from which the display signals d2, d3 for representing the failure conditions of the load 1 are derived among these four display signals d1 to d4. Cathodes of the diodes D15, D16 are commonly connected to one end of a resistor R51. The other end of the resistor R51 is connected to a base of a transistor Q9, whereas an emitter thereof is grounded. To a collector of this transistor Q9, one end of a coil RL1 is connected so as to perform the switching operation by the abovedescribed switching circuit S1. The other end of this coil RL1 is connected to the power source terminal V. Then, from the diagnostic circuit 5a, the display signals d2, d3 for indicating that the load 1a is brought into the shortcircuit or open-circuit failure condition are supplied to the CPU, and from the diagnostic circuit 5a, the feedback signal "e" is supplied to the inverting input (−) of the comparator IC5. Then, the below-mentioned protection operation and automatic recovery operation will be performed.

That is to say, from the control circuit 4a to which the "H"-leveled feedback signal "e" has been supplied, the "L"-leveled control signal "a" is output, by which the load current to the load 1a is interrupted by invalidating all of the operation signals "f" derived from the CPU (not shown). In this CPU, the display operation is carried out so as to display the content of the failure condition in response to the "H"-leveled display signal d2 or d3 received, and also this failure condition is stored until the supply of the power to the CPU is interrupted. When this memory operation and display operation start, then a reset signal "r" is supplied from the CPU to the diagnostic circuit 5a. In the diagnostic circuit 5a to which the reset signal "r" has been supplied, the holding operations by the holding circuit of the shortcircuited load and open-circuited load judging means (not shown in detail) are reset, and both the display signal d2 or d3, and the "H"-leveled feedback signal "e" are changed into "L" levels.

To drive the coil RL1 by the transistor Q9 in response to the display signal "d2" or "d3" at the same time when the display operation by the CPU is carried out, the switching circuit S1 is brought into such a condition that the power is supplied to the load 1b. As a result, even if a lamp is brought into the malfunction condition in, for instance, a tunnel, an illumination of spare purposes can be obtained, resulting in the continuation of safty driving. Then, since the content of the failure condition has been displayed, the repairing work can be quickly executed by a repairing engineer. Also, even when the supply of the power to the CPU is once interrupted, the above-described series of diagnostic operations on the diagnosing, protecting, displaying, and resetting operations so that the similar repairing work can be expected.

Each of anodes of diodes D17, D19 for preventing a signal interference is connected to the output terminals for the display signals d1, d4 for displaying the failure conditions of the drive circuit 3 among four display signals d1 to d4. Cathodes of the diode D17, D19 are commonly connected to one end of a resistor R52. The other end of this resistor R52 is connected to a base of a transistor Q10, whereas an emitter thereof is grounded. To a collector of the transistor Q10, one end of a coil RL2 is connected so as to perform the switching operation of the switching circuit S2, and the other end of the coil RL2 is connected to the power source terminal V. When the display signals d1, d4 for indicating that the drive circuit 3 is brought into the shortcircuited failure or open-circuited failure condition are supplied from the diagnostic circuit 5a to the CPU (not shown), and the feedback signal "e" is supplied from the diagnostic circuit 5a to the inverting input (−) of the comparator IC5, the below-mentioned protection operation and automatic recovery operation are executed.

From the control circuit 4a into which the "H"-leveled feedback signal "e" has been supplied, the "L"-leveled control signal "a" is output by which the load current to the load 1a is interrupted by invalidating all of the operation signals "f" derived from the CPU (not shown). In the above CPU, the display operation for displaying the failure condition in accordance with the display signal d1 or d4 supplied at the "H" level is carried out, and also the failure condition is stored until the supply of the power to the CPU is interrupted. When this memory operation and display operation are commenced, then the reset signal "r" is supplied from the CPU to the diagnostic circuit 5a. In the diagnostic circuit 5a into which the reset signal "r" has been supplied, the holding operations of the holding circuits for the shortcircuited and open-circuited drive circuit judging means (not shown) provided in this diagnostic circuit 5a are reset, and thus, both the "H"-leveled feedback signal "e" and the display signal d1 or d4 are transferred to "L" levels.

To drive the coil RL2 by the transistor Q10 in response to the display signal d1 or d4 at the same instance when the display operation by the above CPU is carried out, the switching circuit S2 electrically separates the failed drive circuit 3 from the load drive circuit, and switches the power supply line to the load 1a by utilizing the fuse "F". As a consequence, for example, when the lamp is failed in a tunnel the spare illumination is available which causes the safety driving. Then, as the failure condition has been displayed, the quick repairing service by a repairing engineer can be achieved. Even when the supply of the power to the CPU is once interrupted, the abovedescribed series of operations such as the diagnosing, protecting, displaying and resetting can be quickly executed, so that the similar repairing work can be performed.

A description will then be made on a load controlling apparatus, shown in FIG. 7, where a spare load apparatus such as a motor as the load 1 is not used. It should be noted that the same or relevant reference numerals shown in the prior art and the abovedescribed preferred embodiments will be employed for denoting the similar or same circuit components shown in FIG. 7.

From a common connecting point of a switching circuit S22 connected to the power source terminal V, the power is supplied to the drive circuit 3a during the normal operation, whereas the power is supplied to the drive circuit 3b when the drive circuit 3a is brought into the malfunction. To a junction between the outputs of these drive circuits 3a and 3b, one end of the current detecting circuit 3 is connected. The other end of the current detecting circuit 2 is connected to one end of the load 1, whereas the other end thereof is grounded.

The operation signal "f" from the CPU (not shown) is supplied to the non-inverting input (+) of the comparator IC5 employed in the control circuit 4a, and the inverting input (−) thereof is grounded via the resistor R53. This output has sufficient voltage and current capacities so as to drive the drive circuits 3a, 3b. The output from the control circuit 4a is supplied to the diagnostic circuit 5b, and connected to a common connecting point of the switching circuit S2b. This switching circuit S2b supplies the control signal "a" to the drive circuit 3a during the normal operation, and the control signal "a" to the drive circuit 3b during the failure condition of the switching circuit S2b.

From the junction between the current detecting circuit 2 and the load 1, the voltage detecting signal "c" and the current detecting signal "b" from the current detecting circuit 2 are supplied to the diagnostic circuit 5a.

The diagnostic circuit 5a supplies the feedback signal "e" and four display signals d1 to d4 for displaying the failure conditions to the CPU (not shown).

Each of anodes of diodes D17, D19 for preventing a signal interference is connected to the output terminals for the display signals d1, d4 to display the failure conditions of the drive circuit 3 among these four display signals d1 to d4 both cathodes of the diodes D17, D19 are connected to one end of the resistor R52. The other end of the resistor R52 is connected to a base of a transistor Q10, whereas an emitter thereof is grounded. To a collector of the transistor Q10, one end of the coil RL2 is connected so as to perform the switching operations by the switching circuits S2a, S2b, and the other end thereof is connected to the power source terminal V. Then, both the display signals d1, d4 from the diagnostic circuit 5a for representing that the drive circuit 3a or 3b is brought into the shortcircuit, or open-circuit failure condition, and also the feedback signal "e" from the diagnostic circuit 5a are supplied to the CPU (not shown), and then, the following protection and automatic recovery operations will be performed.

In the CPU into which the "H"-leveled feedback signal "e" has been supplied, the operation signal "f" is output to the control circuit 4a, which causes the "L"-leveled control signal "a" to be output, whereby the supply of the load current to the load 1a is interrupted, i.e., the protection operation. In this CPU, the display operation for displaying the failure condition in accordance with the display signal d1, or d4 supplied with the "H" level is carried out, and this failure condition is memorized until the supply of the power to the CPU is interrupted. When this memory operation and protection operation are commenced, a symbol is supplied from the CPU to the control circuit 4a, whereby for a short time period, the power is supplied to the load 1 as a test purpose, and the reset signal "r" is supplied to the diagnostic circuit 51. Based upon this reset signal "r", the holding operations of the holding circuits in the shortcircuit and open-circuit judging means for the drive circuit (not shown) employed in the diagnostic circuit 5a is reset, and therefore, the "H"-leveled feedback signal "e" and the display signal d1 or d4 are commonly changed into "L" levels.

To drive the coil RL2 by the transistor Q10 in response to the display signal d1 or d4 quickly than outputting the reset signal "r" for supplying the power to the above CPU for the test purpose, the switching circuits S2a, S2b change the power supply from the failed drive circuit 3a to the drive circuit 3b, and also the control signal "a" from the drive circuit 3a to the drive circuit 3b, whereby the power can be supplied to the load 1.

As a result of the short time power supply to the load for the test purpose, in the CPU where the display signals d1 to d4 from the diagnostic circuit 5a and the feedback signal "e" have been supplied with the normal "L" levels for a predetermined time period, the operation signal "f" having the operation content required for the load 1 is again supplied to the control circuit 4a, and the power is supplied via the drive circuit 3b to the load 1. As a consequence, even if, for instance, the drive circuit 3a for driving the motor of the temperature control for an automatic air mixing device is brought into the malfunction, since the power can be supplied from the spare drive circuit 3b to this drive circuit, the safety and comfortable driving can be realized. In addition, since the failure condition has been displayed, the quick repair service can be received by a repair engineer. Even when the supply of the power to the CPU is once interrupted, the above-described series of operations such as the diagnosing, protecting, displaying, resetting, and test driving operations can be quickly carried out, whereby the similar repairing work can be achieved.

While has been described in detail, when the load drive circuit is brought into a failure, the failure conditions and failed circuit portions can be diagnosed according to the invention, so that the quick repairing work can be surely obtained, and also the proper protection operation can be readily performed. As a consequence, the highly reliable load controlling apparatus according to the invention can be provided where no failure gives adverse influences to other circuits.

What is claimed is:

1. A load controlling apparatus for regulating power flow from a power source (V) to a load (1) having a power input, comprising:
    drive means (3) for controlling supply of power to the load (1);
    control means (4) for supplying a control signal (a) to the drive means (3);
    current detecting means (2) for detecting level of current flow to load (1) and for supplying a current status signal (b) corresponding to the strength of current detected;
    voltage detecting means for providing a voltage status signal (c) corresponding to the voltage of said power input to the load; and
    judging means (5) for judging any extraordinary condition present in the drive means or the load, based upon the control signal (a), and status signals (b) and (c), and thereafter supplying a feedback control signal (e) to the control means (4), and one or more output status signals representing the extraordinary condition judged.

2. A load controlling apparatus according to claim 1, wherein the current detecting means (2) comprises:
    a current detecting resistor (R) in series with the load (1); and
    an operational amplifier (OP) for providing said current status signal based on the voltage across the current detecting resistor.

3. A load controlling apparatus according to claim 1, wherein the judging means (5) comprises:

a plurality of comparator circuits for comparing the control signal (a) with the current and voltage status signals (b) and (c);

a plurality of logic circuits to interpret the output of the comparator circuits and to generate one or more output status signals; and a plurality of holding circuits, such that after an extraordinary condition is diagnosed by the logic circuits, the output status signals are held.

* * * * *